United States Patent [19]
Twitchell

[11] Patent Number: 6,055,021
[45] Date of Patent: Apr. 25, 2000

[54] SYSTEM AND METHOD FOR OBTAINING SYNCHRONIZATION TO A DIGITAL FRAME

[75] Inventor: Ed Twitchell, Quincy, Ill.

[73] Assignee: Harris Corporation, Melbourne, Fla.

[21] Appl. No.: 09/046,126

[22] Filed: Mar. 23, 1998

Related U.S. Application Data

[60] Provisional application No. 60/042,932, Apr. 4, 1997.
[51] Int. Cl.[7] .................................................... H04N 9/475
[52] U.S. Cl. ........................... 348/513; 348/512; 348/524
[58] Field of Search ...................................... 348/512, 513, 348/524; 375/365, 354, 363; H04N 9/475

Primary Examiner—Sherrie Hsia
Attorney, Agent, or Firm—Rogers & Killeen

[57] ABSTRACT

A system and method for obtaining and maintaining synchronization to a digital signal containing framing. The method searches for a synchronizing pattern and maintains a confidence counter indicative of the success in finding the synchronization pattern where expected. The confidence counter can be used to indicate when the system is locked to the framing of the digital signal and when resynchronization needs to occur.

11 Claims, 12 Drawing Sheets

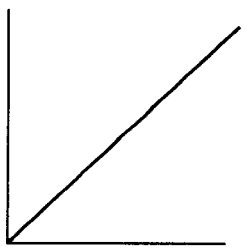 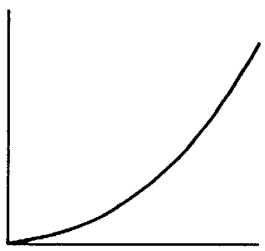 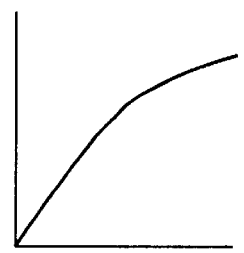 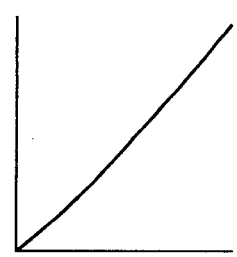
FIG. 12(A)    FIG. 12(B)    FIG. 12(C)    FIG. 12(D)
 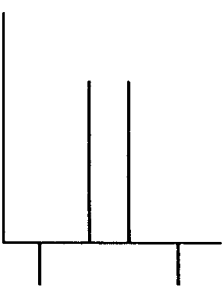 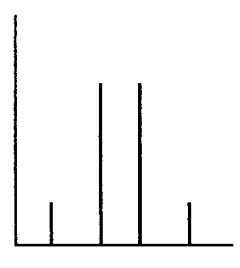 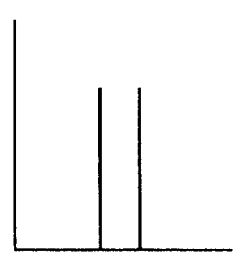
FIG. 13(A)    FIG. 13(B)    FIG. 13(C)    FIG. 13(D)
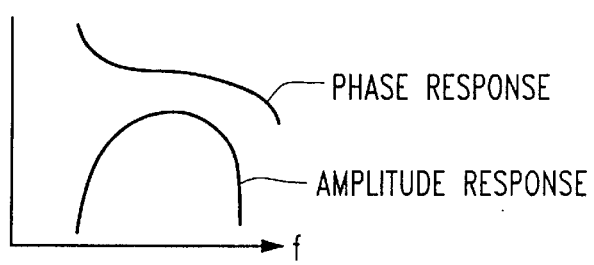
FIG. 14
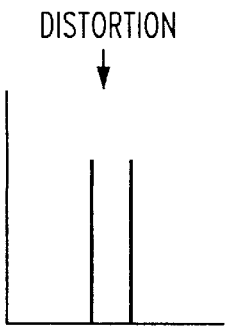 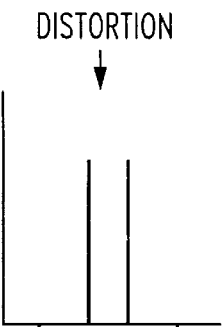 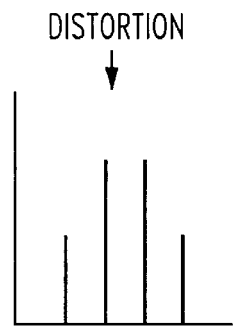 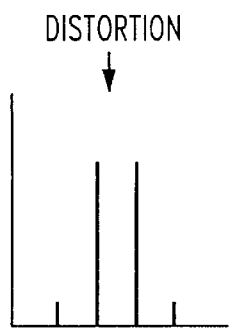
FIG. 15(A)    FIG. 15(B)    FIG. 15(C)    FIG. 15(D)

SYSTEM AND METHOD FOR OBTAINING SYNCHRONIZATION TO A DIGITAL FRAME

BACKGROUND OF THE INVENTION

This application claims the benefit of U.S. Provisional application Ser. No. 60/042,932 filed Apr. 4, 1997.

This application is directed generally to circuits and systems for communicating analog and digital signals and, in particular, to electronic circuits and systems for generating and communicating digital television signals.

For many years commercial television signals have been broadcast using a format known as NTSC. With the advent of high definition television and the increasingly occupied radio spectrum, it has been determined that television broadcasters will provide a simulcast of both NTSC signals and Digital television ("DTV") signals so that the large installed base of NTSC receivers and the newly installed DTV receivers will be simultaneously able to enjoy the same broadcasts. Thus, simultaneous broadcasting will involve the simultaneous transmission of identical programs encoded in two different formats over respective television channels. Both the NTSC and the DTV channels have been defined as being 6 MHZ in bandwidth.

Simultaneous broadcasting in both NTSC and DTV formats will involve the use of two different channels. Because the available spectrum for the additional channels is quite limited, it has been proposed that the additional channels be allocated in channels which are nearby to other existing channels. Where both NTSC and DTV signals are being transmitted over nearby channels, there exists a considerable problem of co-channel interference where the NTSC and DTV signals interfere with each other. The interference problem between nearby channels will be worsened if signals carried on the DTV and/or NTSC waveforms are not precisely located and are not kept within their assigned channel bandwidth.

In proposed DTV systems, and as shown in FIG. 1, a signal bearing video and audio data may be sent from a signal source, such as a television studio to a RF/Transmission site which may not be co-located therewith. In such a system, the video and audio data signals may be transmitted (or transported) from the studio to the RF/Transmission site using conventional communications techniques, such as microwave links. This signal, often referred to as the Transport Signal, will contain both the data and the clock for the data, either separately or by the use of a self-clocking coding such as Manchester coding. Conventionally, the RF/Transmission facility would use the data clock for the purpose of recovering the data at the Transmission facility. Thus, if the Transfer layer clock is inaccurate or drifts, the effect of the inaccuracies would work their way into the signal which is eventually broadcast from the Transmission facility. Given the importance of maintaining accurate broadcast frequency, the frequency errors caused by inaccurate clocks at the Transport layer (often the studio) may be unacceptably high. As described below, in one embodiment of the present invention, the inaccuracies in the data clock can be removed or compensated by the system utilized at the RF/Transmission site so that the signal which is broadcast has stable frequency components.

As described below with respect to another embodiment of the present invention, the problems of co-channel and cross channel interference may be based, at least in part, in differences between the clocks used to generate or transmit the video and/or audio signals from their generation to their broadcast. Such interference may be reduced or eliminated by the use of a common clock to serve as the base for different portions of the signal generation and broadcast systems described herein.

Accordingly, it is an object of the present invention to provide a novel circuit and system for generating a digital television signal in which the frequency based components are precisely generated and/or maintained.

It is another object of the present invention to provide a novel circuit and system for compensating and/or adjusting for inaccuracies in the data clock prior to broadcasting of the television signal.

It is yet another object of the present invention to provide a novel circuit and system that can operate on two asynchronous clocks without synchronous handshaking.

It is further an object of the present invention to provide a novel circuit and system for adding a pilot signal to a television signal.

It is still another object of the present invention to provide a novel circuit and system for error handling in a television signal.

It is yet still an object of the present invention to provide a novel circuit and system for television transmissions where the data signal has its dependency on the frequency of the digital data rate removed and the frequency corrected to its nominal condition.

It is further still an object of the present invention to provide novel circuits and systems for trellis encoding and novel multi-band antennas for a television system.

These and many other objects and advantages of the present invention will be readily apparent to one skilled in the art to which the invention pertains from a perusal of the claims, the appended drawings, and the following detailed description of the preferred embodiments.

BRIEF DESCRIPTION OF THE DRAWINGS

FIGS. 12A–12D are series of plots showing the amplitude and frequency relationship of a theoretical corrected non-linear amplifier and its related signals.

FIGS. 13A–13D are series of plots showing the frequency domain for the series of plots of FIGS. 12A–12D.

FIG. 14 is a plot of the phase and amplitude responses associated with the input and output circuits of a typical non-linear amplifier.

FIGS. 15A–15D are series of plots showing the frequency domain of a typical corrected non-linear amplifier and its related signals.

DESCRIPTION OF PREFERRED EMBODIMENTS

Figure 1:
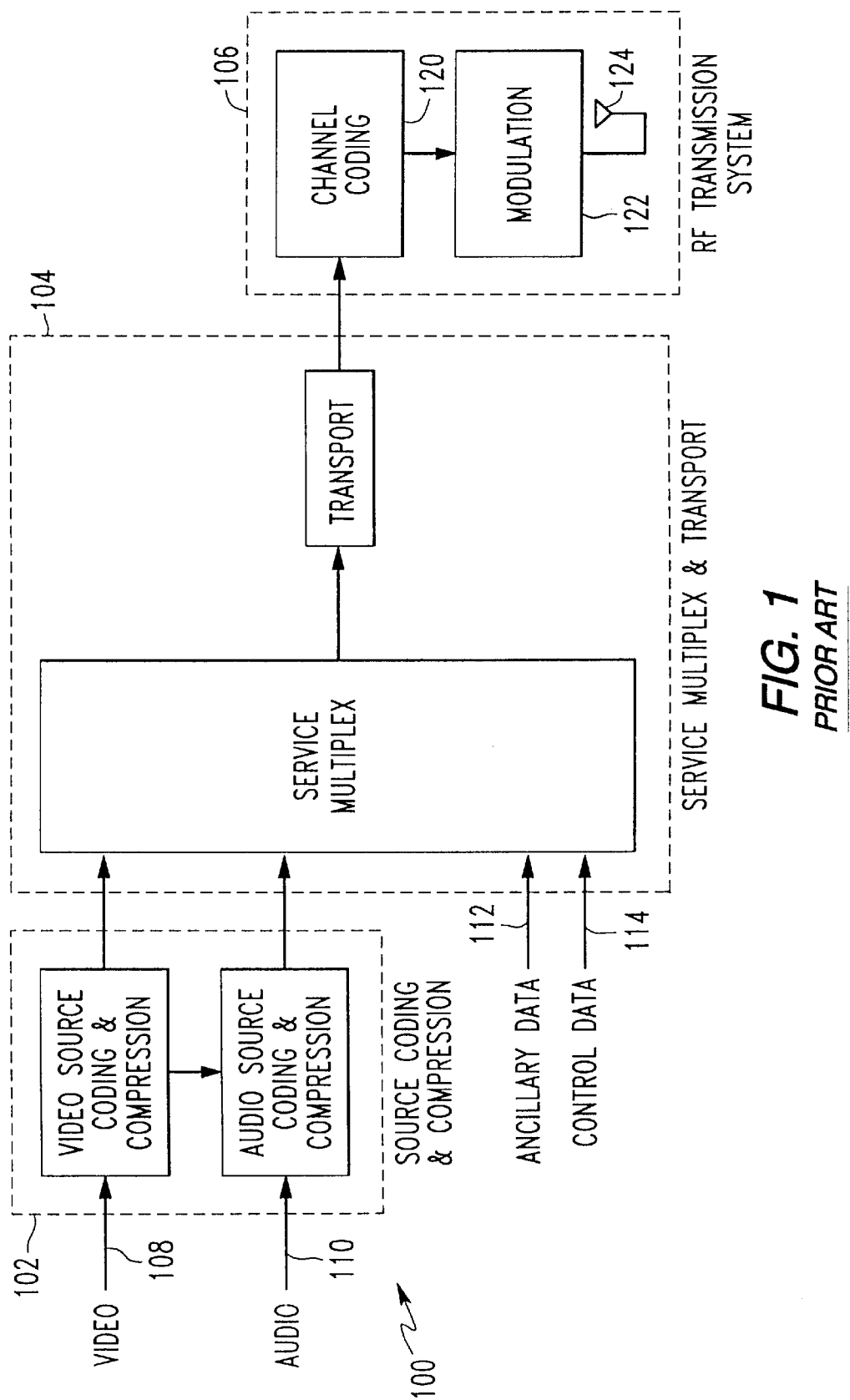
FIG. 1 is a functional block diagram of a prior art digital television system.

As defined by the Advanced Television Standards Committee ("ATSC") Digital Television Standard, dated Sep. 16, 1995, which is incorporated herein by reference, a basic DTV system 100 block diagram consists of three sections, as shown in FIG. 1, including a source coding and compression section 102, a service multiplex and transport section 104, and a RF/Transmission System 106. The source coding and compression section 102 receives a video signal 108 and an audio signal 110 and encodes these signals, respectively, into digital data streams. The encoding may include bit rate reduction methods and compression techniques known and appropriate for video and audio data.

With continued reference to FIG. 1, the encoded video and audio data may be provided to the service multiplex and transport section 104 along with ancillary data signals 112 and control data signals 114. The ancillary signals 112 and control signals 114 may include control data, conditional access control data and data associated with the audio and video services, such as closed captioning. Generally the video signals may be compressed using a MPEG-2 video stream syntax and the audio signals may be compressed using the Digital Audio Compression (AC-3) Standard.

In the service multiplex and transport section 104, the compressed data stream may be divided into packets of information and means for identifying each packet or packet type may be appended. In the process, the video data stream, audio stream and ancillary data stream packets may be multiplexed into a single data stream, as is well known in the art. The packeted data may be transported by the MPEG-2 transport system for the packetizing and multiplexing of video, audio and data signals for digital broadcast systems.

In the RF/Transmission section 106 the packeted data is channel coded and modulated. A channel coder 120 may modify the data stream and add additional information that can be used by the receiver to reconstruct the data from a received signal which has been affected by typical transmission interference sources.

The modulation 122 uses the digital data stream to modulate the transmitted signal. In a DTV standard, the modulation can use an 8 VSB modulation scheme. The modulated signal may be amplified and applied to an antenna 124 for broadcast in a conventional fashion.

Figure 2:
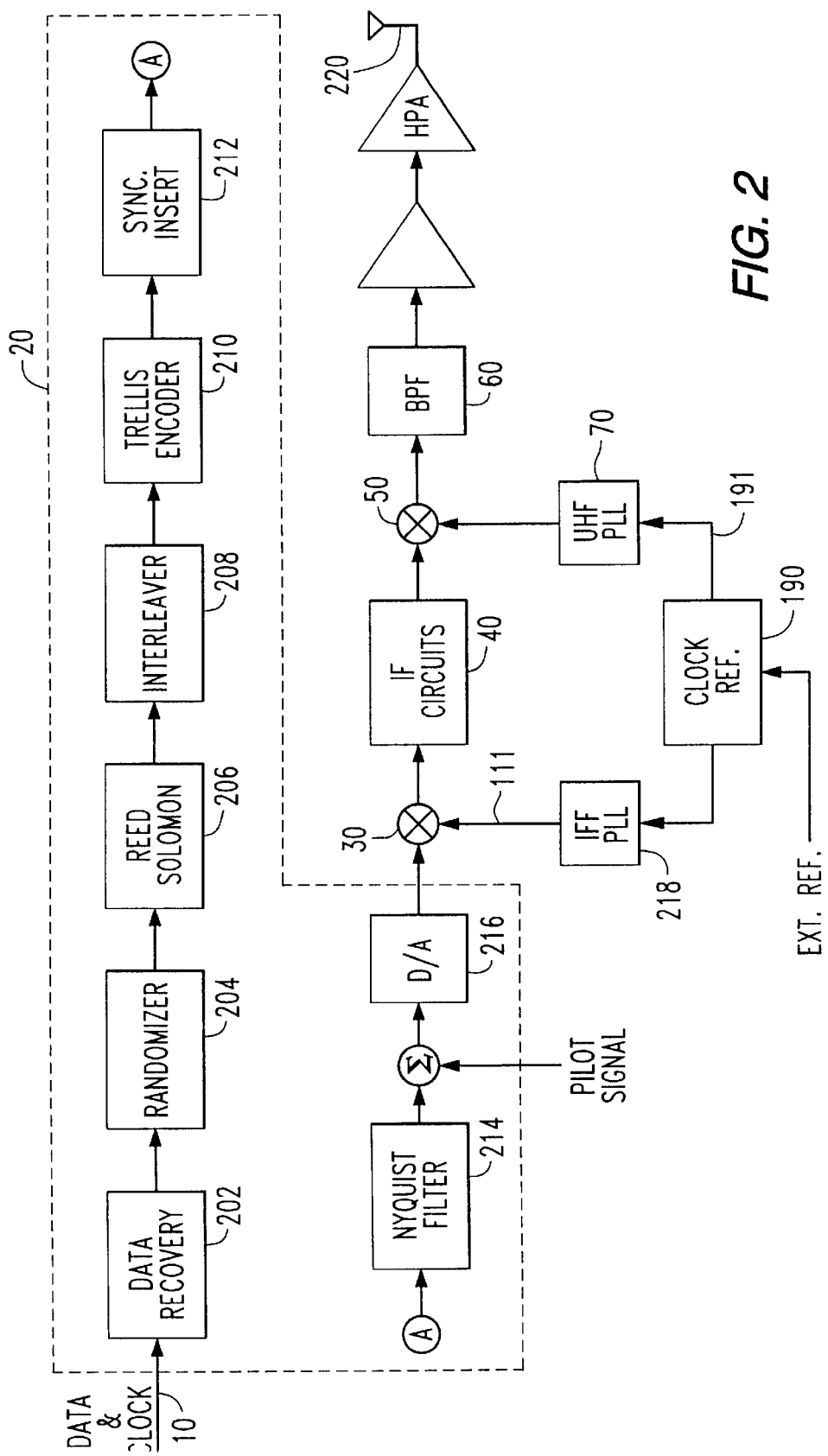
FIG. 2 is a functional block diagram of a circuit in the RF transmission system of the present invention.

With reference now to FIG. 2, a RF/Transmission system in accordance with the present invention may receive a data and clock signal 10 from a transport section as shown in the system of FIG. 1. The data and clock signal may be applied to a data recovery circuit 202 which extracts the data from the transport format, and if necessary extracts the data clock from the same signal. The data signal may be applied to a randomizer 204 which alters the order of the data within the data stream in accordance with the DTV standards. The randomizer 204 may operate based on a generator polynomial and a pseudo random binary sequence.

The signal output from the randomizer 204 may be applied to a Reed Solomon encoder 206 which uses the Reed Solomon encoding technique to provide packets which have been encoded in a predetermined manner, known to the receiver of the signal. The encoded packets are applied to an interleaver 208 which performs a convolutional interleaving on the data in accordance with a predetermined scheme. In the present invention, and as explained further below, the Reed Solomon encoder 206 writes to a data buffer (not shown) at the transport layer data rate, and the interleaver 208 reads the data buffer at the transmission layer data rate. This allows the system to operate on two asynchronous clocks without synchronous handshaking.

The signal output from the interleaver 208 may be applied to a trellis encoder 210. In a DTV system, the trellis encoder employs a ⅔ rate trellis code with one unencoded bit. In the DTV system, one input bit is encoded into two output bits using a ½ rate convolutional code while the other input bit is precoded. In accordance with the DTV specification, the signalling waveform used with the trellis code is an 8-level (3 bit) one dimensional constellation. The signal output from the trellis encoder 210 may be applied to a synch insert circuit 212 which inserts the Data Segment Sync and Data Field Sync at the appropriate locations within the digital data stream.

The digital data stream output from the sync insert circuit 212 may be applied to a Nyquist filter 214 to limit the spectrum of the encoded data stream to the bandwidth of the transmission system (6 Mhz for the standard DTV system). The filtering function in the present invention comprises the steps of: 1) interpolating and upconverting the signal; 2) correcting the signal for non-linearities; 3) equalizing existing frequency response imperfections with an adaptive filter; and 4) downconverting and storing the digital sample.

After the Nyquist filter 214 (and related pulse shaping), a pilot signal may be added. Unlike the prior art, the pilot signal insertion in the present invention saves on circuitry by performing the pilot signal insertion after the pulse shaping by the Nyquist filter. The digital signal provided by the Nyquist Filter 214 to which the pilot has been added is converted to an analog signal by a digital to analog converter 216 and applied to one of the inputs of an IF mixer 30. The other input signal to the IF mixer 30 is an IF carrier frequency which has been derived from an IF Frequency Phase Lock Loop circuit 218. The IF signal generated by the IF mixer is applied to an IF Circuit 40 which filters the IF signal and applies the output signal to one of the inputs of a channel mixer 50. The other input of the channel mixer 50 is a channel frequency which has been derived from a UHF Phase Lock Loop 70. In one embodiment of the present invention, the IFF PLL 218 and the UHF PLL 70 may generate their respective signals from a common clock reference 190. The clock reference 190 may base its clocking signal on an externally derived signal (EXT REF) or on an appropriate clocking signal developed locally or from the data received by the exciter.

The signal output from the channel mixer 50 may be applied to a band pass filter 60 in a conventional fashion to develop a filtered signal which may be amplified sufficiently and provided to an antenna 220 for broadcasting. With continued reference to FIG. 2, the signal input to the data recovery circuit 202 may be either separate data and clock signals or a single embedded clock signal (such as from the use of Manchester encoding). The clock recovery circuit may use a standard phase lock loop to lock onto the clock embedded in the received data. Once the clock is recovered, it may be used to drive the system timing. The data recovery circuit 202 may also include a frame synchronizer to locate the sync signals within the signal sent from the transport section (of FIG. 1) and to align the received data streams into bytes for processing.

With continued reference to FIG. 2, in the standard DTV system, the Reed Solomon encoder requires 20 modulo 256 multiplies and 20 exclusive-or (XOR) adds for each data byte received from the transport section. At the high data rates used in the DTV system, the encoding requires a processor capable of 97 million operations per second. In one embodiment of the present invention, the Reed Solomon encoder may be implemented to achieve such a high data rate in a Field Programmable Gate Array in conjunction with a look-up table.

The Nyquist filter 214 may be implemented as a root-raised-cosine filter with an alpha factor of 0.1152. The filter may be implemented as a Finite Impulse Response filter. In a preferred embodiment, the filter is a complex filter to handle the vestigial sideband function.

Figure 3:
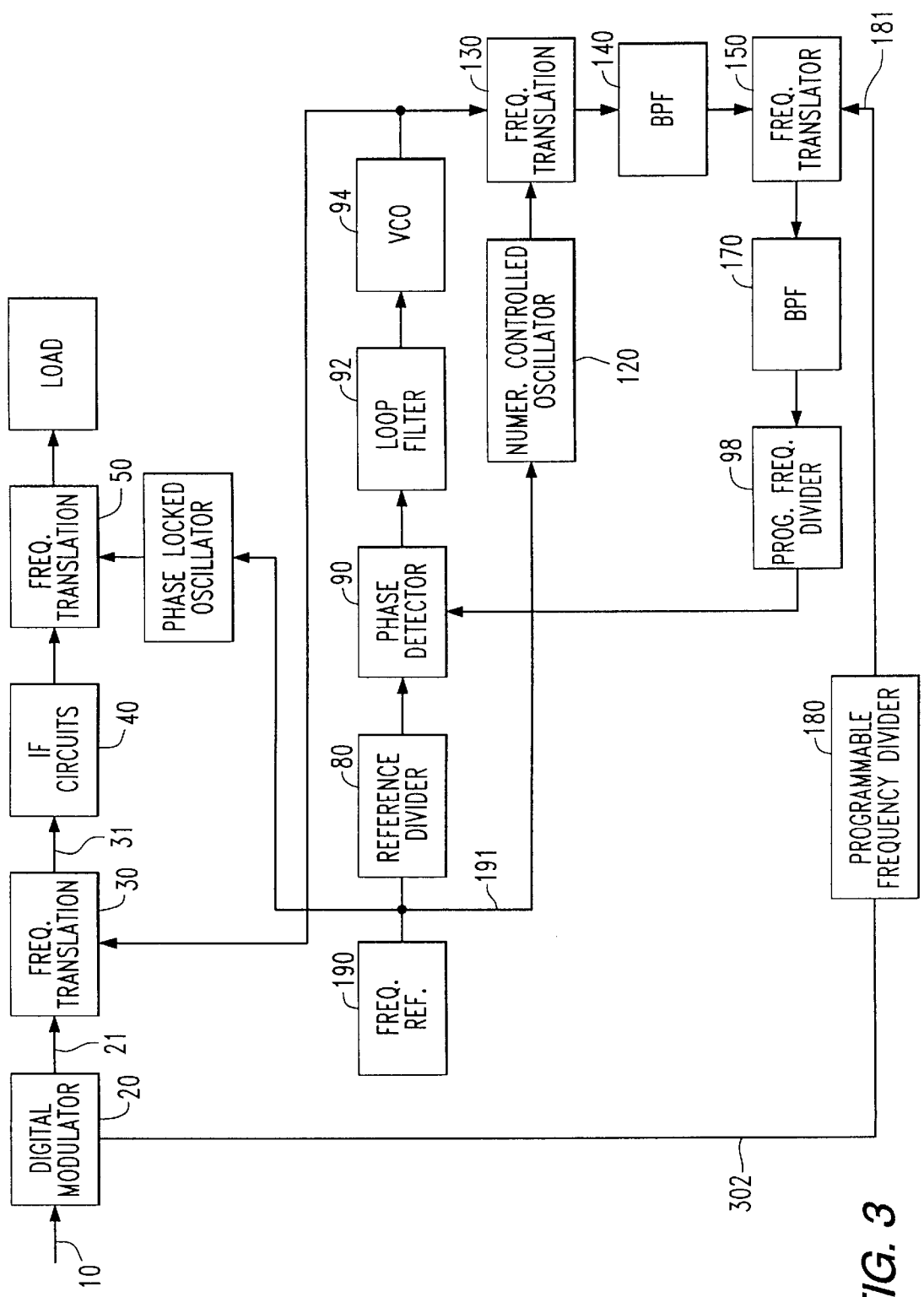
FIG. 3 is a functional block diagram of the RF transmission system of the present invention.

With reference now to FIG. 2 and FIG. 3 (in which common elements have been provided with common reference numerals), in an embodiment of the present invention, the mixers 30, 50 of FIG. 2 and their associated PLLs 218, 70 may be implemented in a circuit in which the modulator 20 portion of the circuit of FIG. 2 is simplified as a single block, modulator 20, of FIG. 3. A data signal 10 applied to the modulator 20 generates a clock signal 302 and a encoded data signal 21 (in analog format). Because both the clock signal 302 and the encoded data signal 21 were originally generated from a digital data stream, the resulting frequencies of these signals are directly proportional to the digital data rate. If these signals were used to develop the signal which is to be transmitted, the transmission signal will be locked to the frequency of the data source. In a situation, as described above, in which the Transmission layer is remote from the Transport layer (and may not even be under common control), a broadcaster transmitting a signal based on a remote data source in such a situation is not in control of the broadcast frequency to the rigid specification required of such broadcasters. In addition, any frequency offsets to the transmitted signals required by the regulating authorities, such as the Federal Communications Commission, for co-channel or adjacent channel interference problems cannot be performed without changing the original data rates. As explained below, in one aspect of the present invention, the dependency of the transmission frequency on the digital data rate is removed by the circuit shown in FIG. 3. This circuit also provides a means for making precision frequency offsets which may be required.

Figure 4:
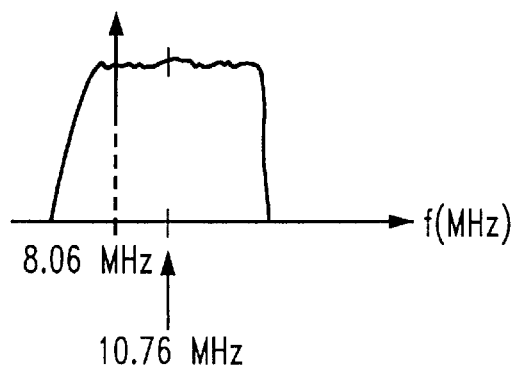
FIG. 4 is an amplitude versus frequency plot for a DTV signal as produced in the present invention.

With reference now to FIG. 3 and FIG. 4, the modulator 20 generates an analog modulated frequency signal of encoded data 21. In a standard DTV signal, the encoded data signal 21 may be in the format of an 8 VSB signal such as specified for DTV. It will be appreciated by those skilled in the art that the encoded data signal 21 could be any other modulated signal, such as an NTSC signal, an FM signal, an AM signal and/or a SSB signal, etc. For the situation of an 8 VSB signal, the signal will have a form as represented in FIG. 4, in which the signal has a nominal center frequency at 10.76 MHz and has a VSB pilot signal nominally at 8.06 Mhz. Normally, the encoded data signal 21 is at a frequency considerably below the frequency at which the signal is to be broadcast and must be upconverted to the broadcast frequency. The encoded data signal 21 is first applied to a frequency translator 30 (such as a mixer) to produce an IF signal 31. In one embodiment of the present invention, a signal having a nominal frequency of 54.76 MHz is applied to the frequency translator to produce the IF signal 31. The IF signal 31 is then applied to a second frequency translator 50 (such as a mixer) through an IF circuit 40 to upconvert the IF signal to the desired channel frequency. The signal output from the second frequency translator 50 may be applied to a load, after amplification as desired.

As explained further below, the frequencies used by the frequency translator 30 to upconvert the encoded data signal is derived from a reference frequency 190 as modified by the data clock 302. In this way, the encoded data signal has its dependence on the frequency of the digital data rate removed and the frequency of the signal is corrected to at or near its nominal condition.

With continued reference to FIG. 3, the digital modulator 20 also produces the digital data clock 302 which is applied to a programmable frequency divider 180 which is 1 to 1 proportional to the carrier or pilot frequency of the digital modulator 20. Thus, the signal 181 output from the frequency divider 180 for a DTV system is nominally at 8.06 MHz. The signal 181 is applied to a third frequency translator 150.

The reference frequency 190 is applied to a reference divider 80, phase detector 90, loop filter 92, and a Voltage Controlled Oscillator ("VCO") 94. The reference signal 191 is applied to a Numerically Controlled Oscillator ("NCO") 120. The signals output from both the VCO 94 and the NCO 120 are applied to a fourth frequency translator 130. The output signal from the fourth frequency translator 130 is band pass filtered ("BPF" 140) and applied to a second input terminal of the third frequency translator 150. The output signal from the third frequency translator 150 is band pass filtered by a second BPF 170 and is divided by a second programmable frequency divider 98 before being applied to the phase detector 90.

In operation, the frequency of the NCO 110 is controlled by the reference frequency 190. The reference frequency may be locally generated or may be received from an external circuit or device (not shown). The reference frequency may be applied to other, similar circuits so that multiple digitally-generated signals may be frequency locked to the same reference.

The NCO 120 should be capable of providing frequency resolution to the extent required by the IF signal 31. The output of the NCO 120 is subtracted from the output of the VCO 94 in the fourth frequency translator 130. The BPF 140 is used to filter out any undesired output from the fourth frequency translator 130.

In operation the third frequency translator 150 subtracts the output signal of the programmable divider 180 from the output of the first BPF 140. The second BPF 70 removes any undesired output from the third frequency translator 150 and applies this difference frequency to the second programmable frequency divider 98. For the nominal signal condition, the second programmable divider 98 and the reference divider 80 are set such that their output frequencies are the same. The outputs of these two dividers 98, 80 are provided to the phase detector 90. Thus, the output of the phase detector 90 is proportional to the phase difference between its two inputs and is applied to the loop filter 92. The loop filter 92 converts the output of the phase detector 90 into a voltage which is proportional to the phase difference and applies this voltage to the VCO 94. As a result, the VCO 94 is frequency locked to the reference frequency and not to the original digital rate.

In operation with an input data signal at an off-nominal data rate, the circuit of FIG. 3 removes the effect of the off-nominal rate. For example, if the clock rate of the incoming data 10 is off nominal by "delta" the frequency of the signal 302 will equal 10.76 MHz+delta and of the signal 181 will equal 8.06 MHz+delta. The delta is propagated through the reference frequency components and ultimately through the VCO 94 so that the signal used to upconvert at the first frequency translator 30 is also offset from the nominal by delta. Since the data signal at signal 21 is also offset by delta, the first frequency translator 30 will subtract out the two delta components leaving the signal 31 free of the delta offset.

In the DTV standard transport protocol, the sync signal (a byte) is not a unique number. Accordingly, a false indication of synchronization may be given if any eight contiguous bits of data are identical to the sync byte. The present system overcomes the effect of this false sync by using a confidence counter. The confidence counter counts the number of sync bytes continuously. With reference to FIG. 2, if a sync byte is not detected by the data recovery circuit 202 when expected, confidence of having sync lock is reduced and the confidence counter is decremented. If several frames occur without a sync byte being detected at a specific byte location within the data stream, the frame synchronizer will indicate that the system is out of sync lock and can automatically begin a new frame search and acquire operation.

Figure 5:
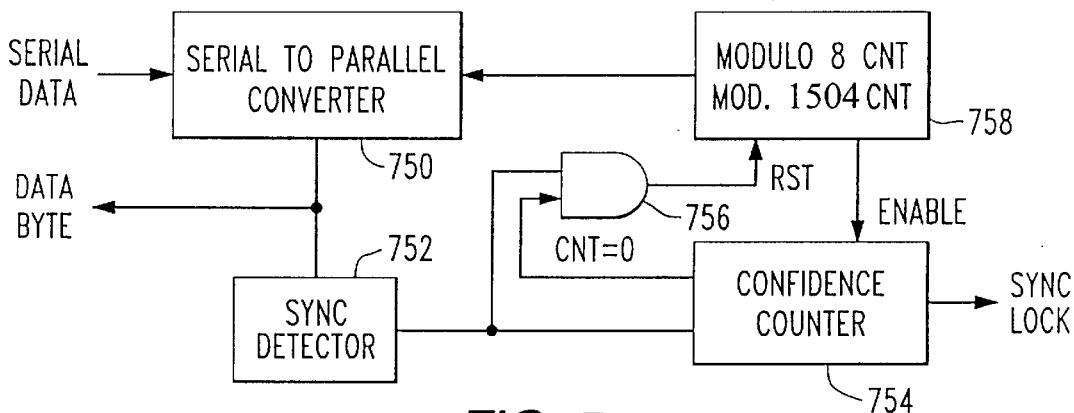
FIG. 5 is a functional block diagram of a sync confidence counter circuit of the present invention.

With reference now to FIG. 5, in one embodiment of the present invention, a frame and bit synchronizer using a confidence counter may receive data as received from the transport layer in a serial form (SERIAL DATA), the serial data may be converted to a parallel form (such as an 8 bit parallel data word) by a serial to parallel converter 750 and provided to a sync detector 752. The sync detector 752 compares the data word to a predetermined sync word and a signal sync indicating whether sync was found is provided to a confidence counter 754 and to AND gate 756. The confidence counter 754 increments a counter if sync was found where expected and decrements the counter if sync was not found where expected. A sync is "expected" exactly one frame from the last detected sync word. Thus, a modulo counter 758 counts the number of words encountered since the last sync detection and enables the confidence counter 754 at that word at which sync is expected. If the confidence counter 754 reaches a predetermined value, the frame is considered in sync and a SYNC LOCK signal is sent to other elements in the circuit and/or displayed for the system operator.

The AND gate 756 in the presence of a 0 count in the confidence detector 754, provides a RST pulse to the modulo counter 758. Thus, if the confidence counter 754 is decremented to zero, sync is considered to be lost causing the SYNC LOCK signal to be removed and resetting the frame search initiation circuit of the modulo counter 758 to begin the search for sync anew (i.e., starting a new frame search and acquire mode).

With continued reference to FIG. 5, the modulo counter 758 also provides a modulo 8 count of serial bits coming into the serial to parallel converter 750. In this way, the converter 750 remains bit aligned with the rest of the sync detection circuit. At the end of each modulo 8 count, the data word is provided to the data randomizer along with being provided to the sync detector. The data randomizer and other elements of the circuit can use the SYNC LOCK signal to determine whether the data byte is valid. The confidence counter can readily be modified to obtain any degree of confidence that sync lock has been achieved; generally, the higher confidence required necessitating a longer sync detection time. In addition, the loss of sync lock need not wait until the confidence counter returns to zero (e.g., five correct sync detections could be required to obtain lock but only three consecutive failures to detect sync could cause a loss of sync.) Similarly, the number of successful sync detections can be capped so that once sync has been locked, the confidence counter will not increment past the locking value (but will decrement if an expected sync is not found).

At the startup after the loss of input sync, the confidence counter circuit is set to begin an acquisition mode. In the acquisition mode, the serial data bits are clocked serially into the serial to parallel converter 750 which may take the form of an 8-bit buffer. Thereupon, at each clock cycle, the 8 bit data word is checked for the presence of the sync byte. If the sync byte is detected, a count enable bit is set and the circuit enters a confidence testing mode. Whenever the count enable bit is set, the frame counter circuit of the modulo 1504 counter begins counting until the next 1504 bits (188 words of 8 bits each, or 1 frame) have been transmitted. At this time, the sync is checked again and if present the process is repeated. If the sync byte is not present, the count enable bit is reset and the acquisition mode is restarted. If a predetermined number of consecutive frame syncs are detected, the SYNC LOCK signal is set and the circuit enters a Frame Lock mode. thereafter, normal operation begins and the frame sync is checked continually to ensure reliable transmission. If frame sync is not found for a predetermined number of frames, the circuit will switch back to the acquisition mode, restarting the entire process.

Note that the confidence counter circuit of the present invention may be utilized in both the transmission of the DTV signal and in receivers attempting to receive and display DTV or other digitally framed signals. Such receivers are faced with a similar problem of establishing and maintaining frame sync as described above and the circuit of the present invention will also be useful to such receivers.

Figure 6:
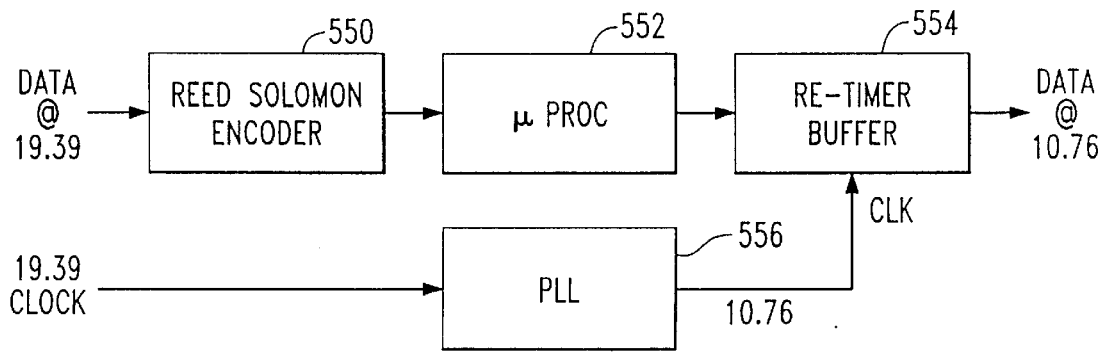
FIG. 6 is a functional block diagram of an interleaving circuit of the prior art.

As mentioned above, in one aspect of the present invention, the frequency of the signal used in the transport layer can be made independent of the frequency of the signal in the transmission layer by a data interleaver. It was known in the prior art to interleave data in a manner in which the frequency of the data was changed. For example, and with reference now to FIG. 6, a signal from the transport layer, carrying the data at a 19.39 MHz rate, would typically be provided to a Reed Solomon encoder for encoding in a conventional fashion. The data exiting the Reed Solomon encoder 550 would be provided to a microprocessor 552 which would interleave the encoded data and provide it, at an arbitrary rate, usually in a burst mode, to a Re-Timer Buffer 554. The Re-Timer Buffer 554 will typically buffer the burst mode data from the microprocessor and output a signal at a specific rate as governed by its clock, usually the standard 10.76 MHz rate. Often in prior art systems, the 10.76 MHz clock signal provided to the Re-Timer Buffer 554 would be generated from a PLL 556 being driven from the 19.39 MHz clock (often obtained from the data).

Figure 7:
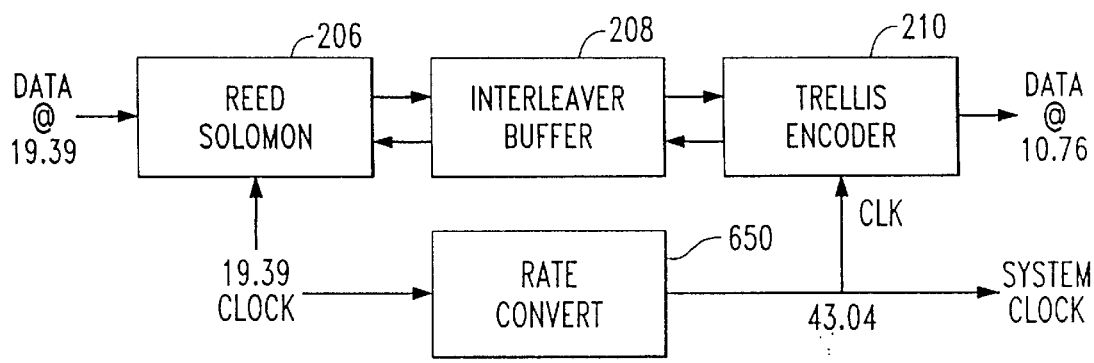
FIG. 7 is a functional block diagram of an interleaver buffer circuit of the present invention.

In another aspect of the present invention, the burst mode microprocessor of the prior art may be eliminated with a suitable interleaver buffer. With reference to FIG. 7, a Reed Solomon encoder 206 may receive the data at the frequency of the transport layer, 19.39 MHz, and provide the encoded data to a data interleaver buffer 208. The data is read out of the interleaver buffer 208 at a rate of 43.04 MHz and provided to the trellis encoder 210 which outputs the trellis encoded data at the 10.76 MHz rate generally associated with the transmission layer. Note that the rate converted 43.04 MHz clock is available to the trellis encoder 210 and therefor can be used to time the extraction of the data from the interleaver buffer 208 and for the trellis encoding. The clocks to the trellis encoder are provided by a rate converter 650 which converts its incoming 19.39 MHz clock signal by a ratio of 313*207*832/312/188/828 to develop a 43.04 MHz clock signal. The resulting clock signal can be decreased or divided by a factor of 4 to provide a 10.76 MHz clock and may be provided to other elements in the transmission layer. Note that in this aspect of the present invention, the digital elements to either side (input or output) of the interleaver buffer 208 are made more simple than in the prior art because these elements can operate in a continuous mode and do not have to be sized for burst mode operations.

With continued reference to FIG. 7, the 19.39 MHz clock may be obtained from the data (as received or as corrected in another aspect of the present invention) or from a local oscillator. The use of a local oscillator ensures that the trellis encoder will continue to operate despite the loss of the transport signal or the loss of the clock in the transport signal. Indeed, the local clock can be used to drive the Reed Solomon encoder in the event of a loss of signal from the transport layer (the encoded signal). Because at least one promulgated standard requires that the transmission layer continue to transmit a signal (generally a pseudorandom signal) even if the originally encoded signal is lost, keeping the Reed Solomon encoder in operation provides the necessary data signals to maintain a transmission signal.

In yet another embodiment of the present invention, if a sufficiently robust Digital Signal Processor ("DSP") is used, all of the Reed Solomon encoding, data interleaving and trellis encoding and frequency conversion can be accomplished in a chain of one or more suitably programmed DSPs which have been provided with the desired clock(s).

Figure 8:
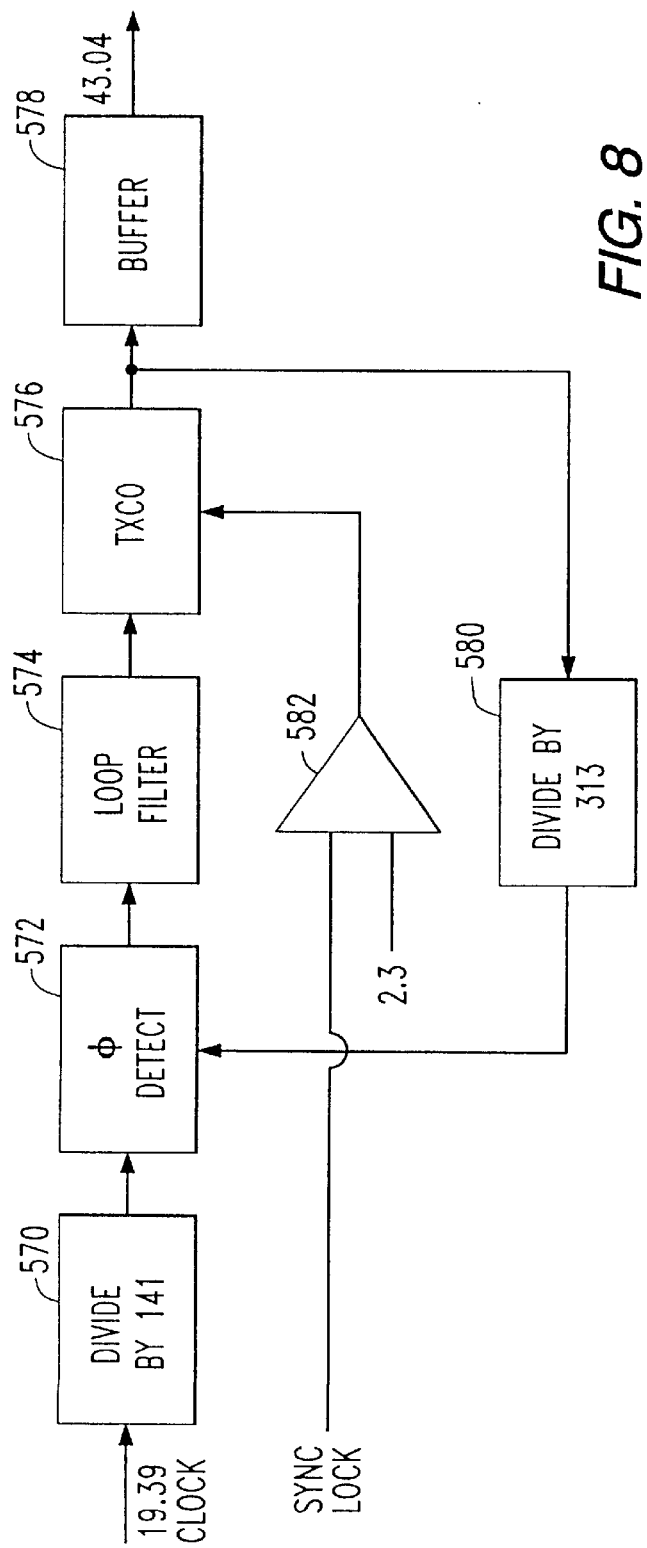
FIG. 8 is a functional block diagram of a rate conversion circuit of the present invention.

With reference now to FIG. 8, a rate converter circuit in accordance with one aspect of the present invention may include a Divide By 141 circuit 570 which receives a clock signal (such as a 19.39 MHz signal) and provides the frequency divided signal to a phase detect circuit 572 and, subsequently, to a loop filter 574 which drives a thermally compensated voltage controlled oscillator 576. The output of the TXCO 576 is provided to a buffer 578 and is fed back to a Divide By 313 circuit 580 which is also connected to the phase detector 572. The TXCO 576 has a center frequency at the desired output frequency (e.g., 43.04 MHz) and has a rail at +/−3 Hz which is the maximum permitted deviation of the carrier frequency in a standard DTV system.

In operation, so long as a clock frequency is present at the input to the circuit and the frequency of that signal is within the desired limits of the system, the generated 43.04 MHz clock may be permitted to track the input signal. If the input signal varies in frequency outside the limits, the TXCO 576 will not go outside its rails and will limit maintain the output frequency within the required specification.

With continued reference to FIG. 8, the useability of the input signal to serve as the basis for the output signal may be indicated by an external signal, such as the SYNC LOCK signal described herein in association with the confidence counter circuit. When the system is out of sync, a gate 582 can provide a voltage signal which will drive the TXCO 576 to the desired output frequency. If desired, the magnitude of the voltage signal can be set by the operator of the system, such as through a user-settable potentiometer (not shown).

Figure 9:
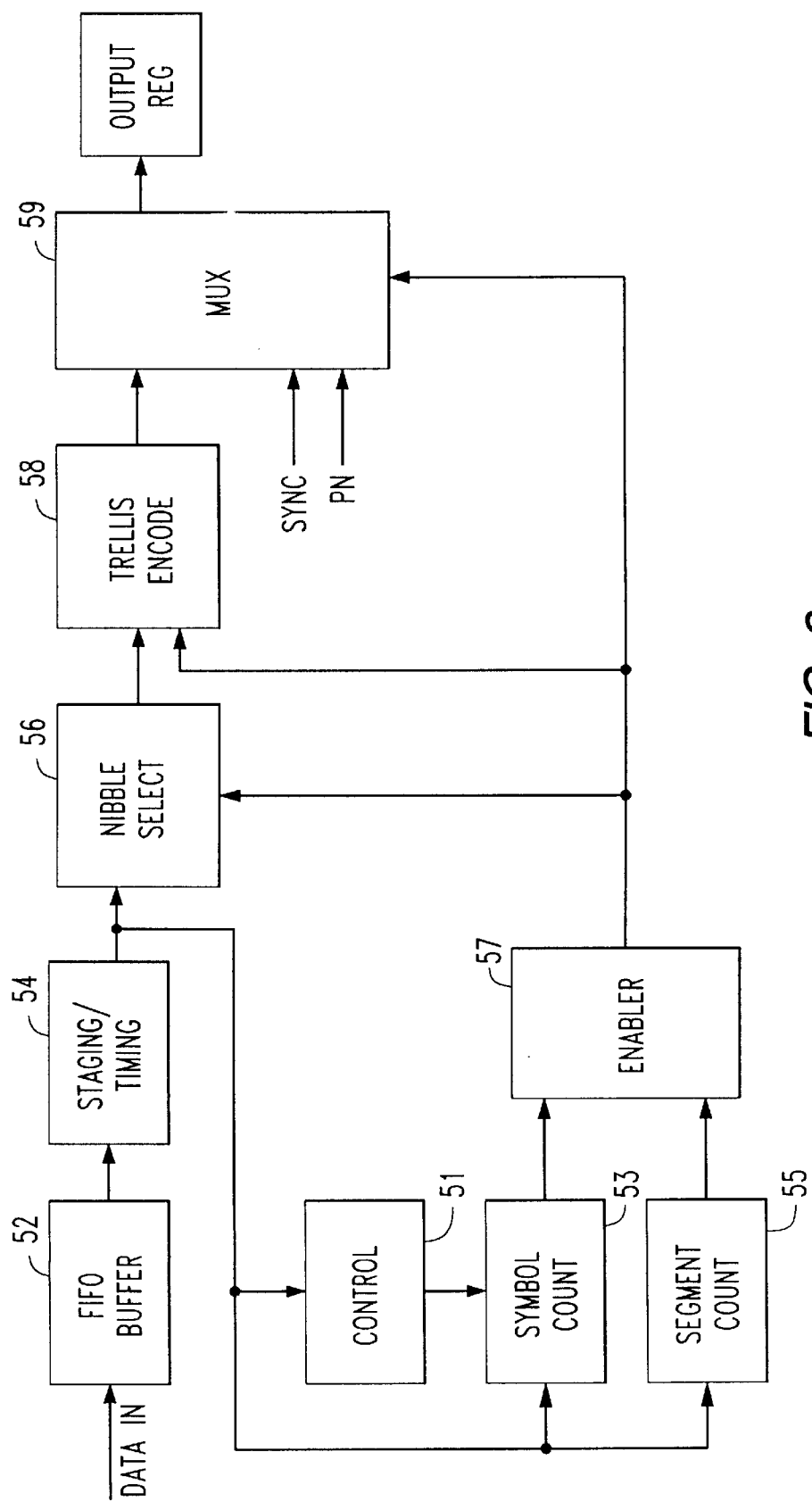
FIG. 9 is a functional block diagram of a first embodiment of a control circuit for a trellis encoder of the present invention.

With reference now to FIG. 9, a trellis encoder which may be used in the present invention receives a stream of digital data to be encoded (DATA IN). The digital data stream is applied to a FIFO Buffer 52 and a Staging/Timer Circuit 54 to align the data in time with the remainder of the circuit. At the appropriate time, the data are applied to a nibble select circuit 56 which selects the appropriate two bit nibbles from the input digital data in accordance with the rules of the encoding scheme. In turn, the selected nibbles are encoded by a trellis encoder 58 (which for the DTV system supplies 3 bits of output data for each two bits of data input to it). The data output from the trellis encoder 58 are supplied to a multiplexer which multiplexes the data with sync bits and/or with pseudo random number encoding output of the multiplexer 59 is supplied to an output register 59. The operation of the circuit of FIG. 9 is controlled by control logic 51 which coordinates framing of the data, resetting symbol and segment counters 53, 55 as appropriate. The outputs of the counters 53, 55 are provided to an enabler 57 which provides pacing signals to the other elements of the circuit so that each element needing to know the location of the incoming data within the frame will have that data available.

In operation, a digital data stream is provided to the trellis encoder circuit and is received by the input buffer and staging elements. The control logic 51 reviews the incoming data to determine frame boundaries. Once framing has been established, the control logic 51 resets the symbol counter 53 and the segment counter 55 to start a new frame. As the data is thereafter received, the symbol and segment counters 53, 55 are incremented and cycle themselves in accordance with the format of the data. The symbol and segment counters 53, 55 drive the enabler 57 which sends the appropriate control/selection signals to the other elements of the circuit.

With continued reference to FIG. 9, guided by the signals from the enabler 57, the nibble select circuit 56 selects the appropriate nibbles from the input data stream to be encoded next. In the case of a standard DTV signal, the nibbles selected are done in accordance with the DTV specification [Annex D, table 2 to the Digital Television Standard], although any other conversion scheme could be implemented. Thereafter, each nibble is encoded in the order selected by the trellis encoder 58. As appropriate for the specified protocol and as guided by the enabler 57, the multiplexer alternatively outputs the trellis encoded data or sync data in accordance with the protocol being followed by the system. In the event that an input data signal is lost or loses sync, a pseudorandom stream of data bits ("PN") can be applied by the multiplexer 59 to the output data stream.

Figure 11:
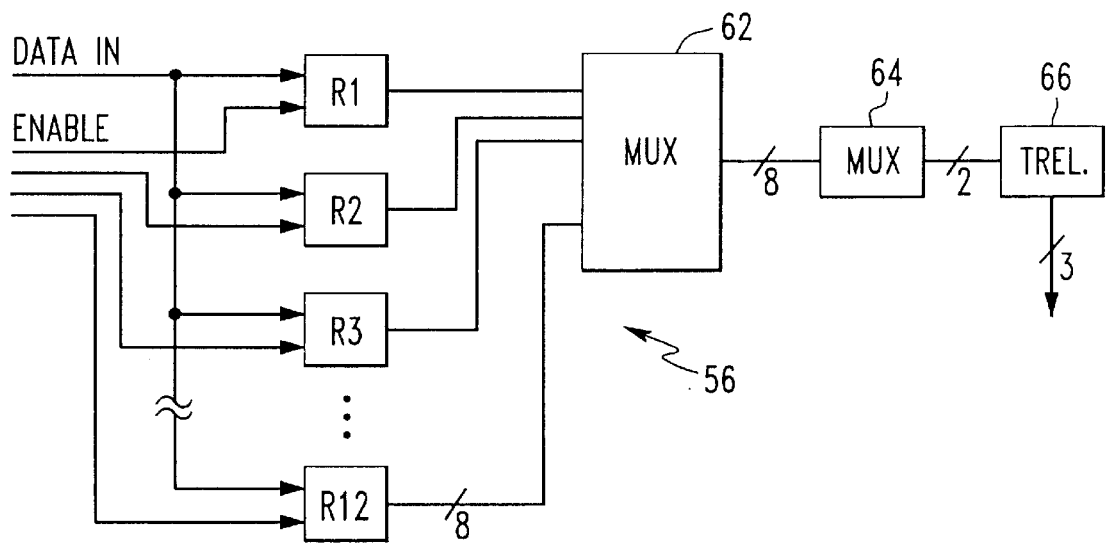
FIG. 11 is a functional block diagram of a second embodiment of a trellis encoder of the present invention.

With reference now to FIG. 11, a nibble select circuit 56 which may be used in the present invention receives a stream of digital data (DATA IN) at each of twelve storage registers R1,R12. The stream of input data arrives serially and My be cycled into successive ones of the storage registers R1,R12. The twelve registers are connected to one side of a first multiplexer 62. Under control of a multiplexer control signal (not shown) based on the location of the input data within the frame, the first multiplexer 62 presents one of the bytes of input data at its output terminals. A second multiplexer 64 under control of a second multiplexer control signal (not shown), receives the selected byte and selects two bits of the data to output. The output bits are applied to the trellis encoder 66 which encodes the two bits into three bits which are then passed to the next stage in the transmission system.

Figure 10:
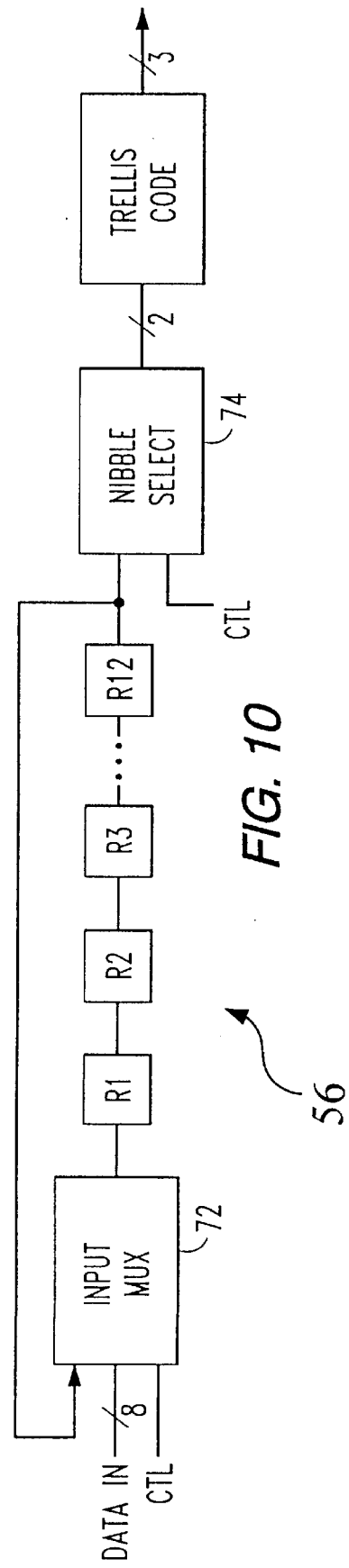
FIG. 10 is a functional block diagram of a first embodiment of a trellis encoder of the present invention.

With reference now to FIG. 10, a nibble select circuit 56 which may be used in the present invention receives a stream of digital data (DATA IN). A trellis encoding circuit may include an input multiplexer 72 which loads the first of a series of twelve registers R1,R12 with data from either an input multiplexer 72, from the first of a series of twelve registers R1,R12, or from the contents of the last register in the series (R12) so as to cause all of the registers to cycle through. At each bit selection time, the contents of the last register (R12) are presented to a nibble select circuit 74 which selects two of the bits from the last register R12 in accordance with the preselected protocol. As each nibble is selected from the last register, the contents of the registers are cycled one register at a time, so that all of the twelve bytes within a segment are provided to the nibble select circuit 74, in turn, a total of four times. When all of the bits of the twelve words have been output from the nibble select circuit 74, the input multiplexer 72 loads new data into the twelve registers R1,R12 to encode the next segment of data.

Figure 11A:
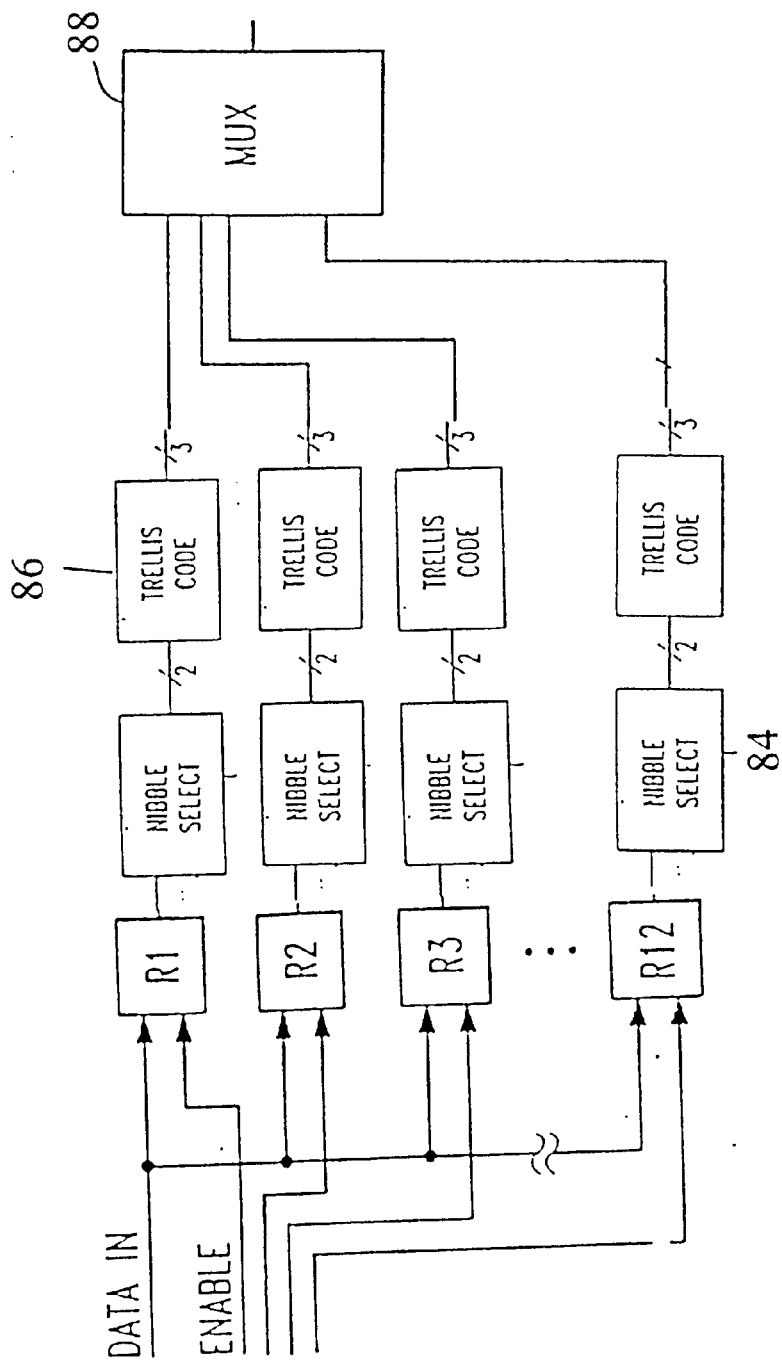
FIG. 11A is a functional block diagram of an another embodiment of a trellis encoder of the present invention.

Still another embodiment of a trellis encoder circuit in accordance with one aspect of the present invention is shown in FIG. 11A in which an input data stream (DATA IN) is directed by a first multiplexer 82 (not shown) to twelve parallel registers R1,R12. Once the registers are loaded, nibble select circuits 84 associated with each of the storage registers R1,R12 will select two data bits from their associated storage registers R1,R12 and provide the selected bits to an associated trellis encoder 86. Each trellis encoder 86 encodes the received bits in accordance with the predetermined encoding scheme and provides the three encoded bits to the input of an output multiplexer 88. The output multiplexer selects the encoded bits from the appropriate trellis encoder 86 in accordance with the protocol. Note that the trellis encoder of the embodiment in FIG. 11 requires a depth of 1 whereas the trellis encoders of FIG. 10 requires a depth of 12 if the trellis encoding scheme of the standard DTV system is being used.

It is well known in the prior art that signal amplifiers often introduce non-linearities into the signals being amplified. To linearize signals which are to be amplified by such non-linear amplifiers, it is also well known to pre-distort the input signal in a manner which is opposite to the non-linearity effects expected to be applied by the amplifier. For example, and with reference to FIGS. 12A–12D (showing the amplitude of the signal versus frequency), an input signal having the form in FIG. 12(A) will be pre-distorted (or pre-corrected) by a transfer function as shown in FIG. 12(B). After the amplifier applies the amplification effect shown in FIG. 12(C) to the precorrected input signal, the corrected, amplified signal form is obtained, as shown in FIG. 12(D). For further explanation, in FIGS. 13A–13D are depicted the same signals and effects as shown in FIGS. 12A–12D, this set of drawing figures being shown in the frequency domain.

It has been found that the success of the prior art precorrection methods are usually limited to the amplifier's frequency response and the system band width. Pre-correction products which have been used to cancel the amplifier's distortions are modified in phase and amplitude by the amplifier's input circuits. These changes in the phase and amplitude limit the cancellation of the distorting products in the amplifier. For example, the input circuits of a typical amplifier often have the amplitude and phase responses shown in FIG. 14 over the frequency bands of interest. These amplitude and phase changes prevent the precorrection from cancelling all of the unwanted distortion of the amplifier. The resultant signals which are usually obtained in such a circuit are shown in FIGS. 15A–15D, a frequency domain series of drawings. Note the sidelobes of frequency elements caused by the uncorrected distortion.

One means for eliminating the unwanted non-linearities is to insert an amplitude and phase corrector between the prior art pre-correction and the non-linear amplifier. The corrector is adjusted so that its amplitude and phase responses are the inverse of the amplitude and phase responses of the non-linear amplifier.

Figure 16:
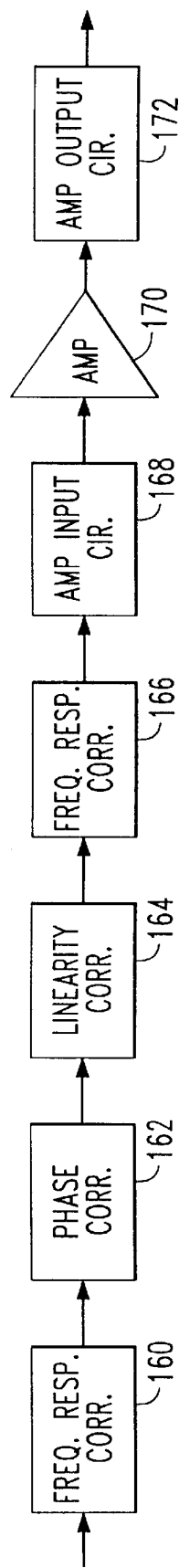
FIG. 16 is a functional block diagram of an improved corrector circuit in accordance with one aspect of the present invention.

With reference to FIG. 16, a circuit which can carry out the improved amplifier system response may include a non-linear amplifier 170 and its associated amplifier input circuits 168 and amplifier output circuits 172. A precorrection circuit for amplitude versus input (i.e., a linearity corrector) 164 and for phase versus input (i.e., a phase corrector) 162 may adjust for non-linearities in a conventional fashion for the particular amplifier 170 and the frequency ranges of interest. A frequency response and phase corrector 166 is placed between the linearity corrector 164 and the amplifier input circuits 168 and is adjusted to compensate for the inputs circuits so that the net result of the cascaded pair of elements (corrector 166 and circuits 168) is unity. In this way, the precorrection signal can be fully compensated in the non-linear amplifier 170.

Note that in the circuit of FIG. 16, the phase corrector 162 precedes the linearity corrector 164. This is the preferred configuration of these correctors because if these correctors are reversed in order, the adjustment of the amplitude pre-correction would cause undesired changes in the phase pre-correction. These undesired changes can be eliminated; however, the adjustment of the circuit to eliminate the effects of the undesired interaction is made more difficult.

The amplifier output circuits 172 of the non-linear amplifier 170 will often also modify the overall system frequency and phase response. To control this effect, a frequency response corrector 160 can be added to correct the overall system for transparency in frequency and phase response.

The frequency response correctors 160 and 166 may each be realized in piecewise linear correction circuits which can individually modify a signal's frequency response and group delay (or phase) response over a specified frequency range. These correctors should be capable of: (1) modifying amplitude versus frequency independently of phase (delay); and (2) modifying phase (delay) versus frequency (so called "group delay"). In a preferred embodiment, the frequency response correctors would implement these stated capabilities independently of each other.

The phase corrector 162 may be realized in a piecewise linear correction circuit which can modify a signal's phase transfer function as a function of the input level and are well known in the art. The linearity corrector 164 may be realized by a conventional piecewise linear correction circuit which can modify a signal's linearity transfer function as a function of the input level and are also well known in the art. The amplifier used in the circuit of FIG. 16 may be any device intended to increase the level of an input signal to a higher level but generally has non-linearities or discontinuities in its transfer function. Such an amplifier may be solid state (such as a bipolar, MOSFET, LDMOS, silicon carbide, etc.) or may be a vacuum tube (such as an IOT, tetrode, klystron, etc.). The amplifier input circuits 168 may typically include input circuits to the amplifier such as input matching circuits, filters, cavities, circulators, etc. The amplifier output circuits 172 may typically include output circuits from the amplifier such as output matching circuits, filters, cavities, circulators, etc.

In practice, the set of correctors used in this aspect of the present invention would preferably be designed starting with the phase corrector 162 and linearity corrector 164. Such corrector circuits can be designed conventionally to produce a desired predistorted signal inversely matching the abnormalities of the amplifier. Having designed the linearity and phase correctors, the frequency response corrector which comes after the linearity corrector can next be designed as it will correct for the frequency related errors caused by the amplifier input circuits. Finally, the frequency response corrector at the beginning of the signal flow can be designed to obviate errors in the overall transfer function including the amplifier output circuits.

Figure 17:
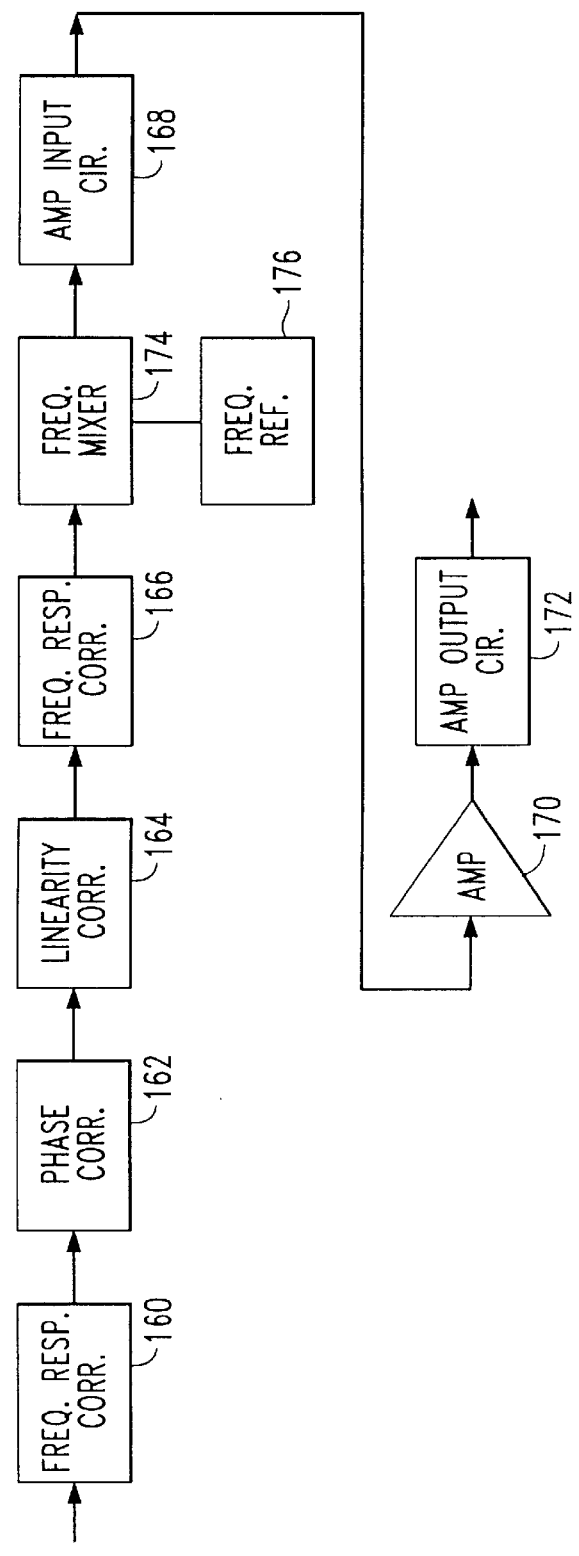
FIG. 17 is a functional block diagram of a second embodiment of the corrector circuit of FIG. 16, particularly for use in an intermediate frequency compensation circuit.

With reference now to FIG. 17, in which elements in common to the elements of FIG. 16 have been provided with a common reference numeral, it is known that pre-correction in prior art systems is often accomplished at an intermediate frequency. The block diagram of this aspect of the present invention may be modified as shown in FIG. 17 where a frequency mixer (or translator) 174 is placed between the precorrection elements and the non-linear amplifier 170. The mixer 174 may be supplied with a signal from a frequency reference 176 to translate the signal being amplified to a new frequency. The frequency reference 176 may include an oscillator, tuned circuit, external reference, or any conventional means or circuit to provide a reference frequency.

Figure 18:
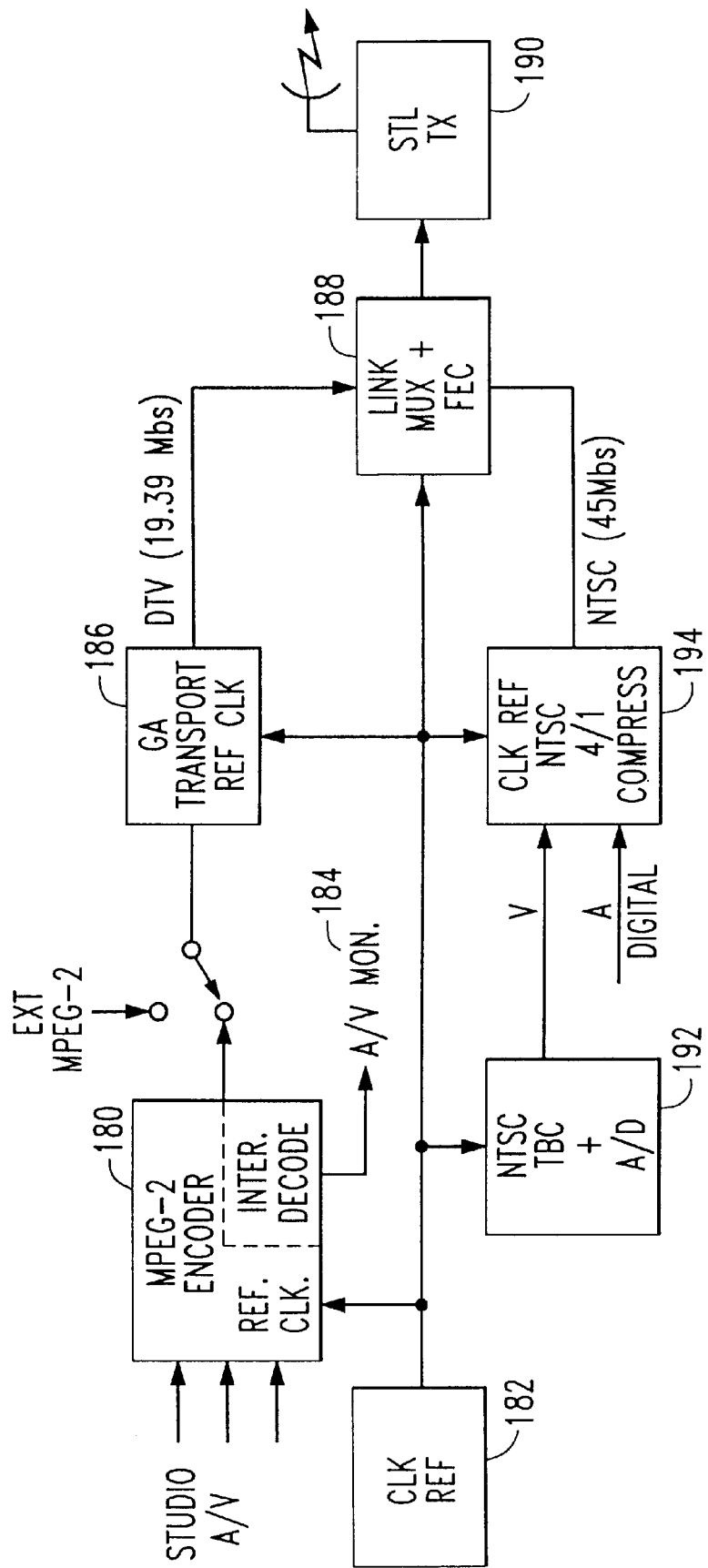
FIG. 18 is a functional block diagram of a studio site using an aspect of the present invention.
Figure 19:
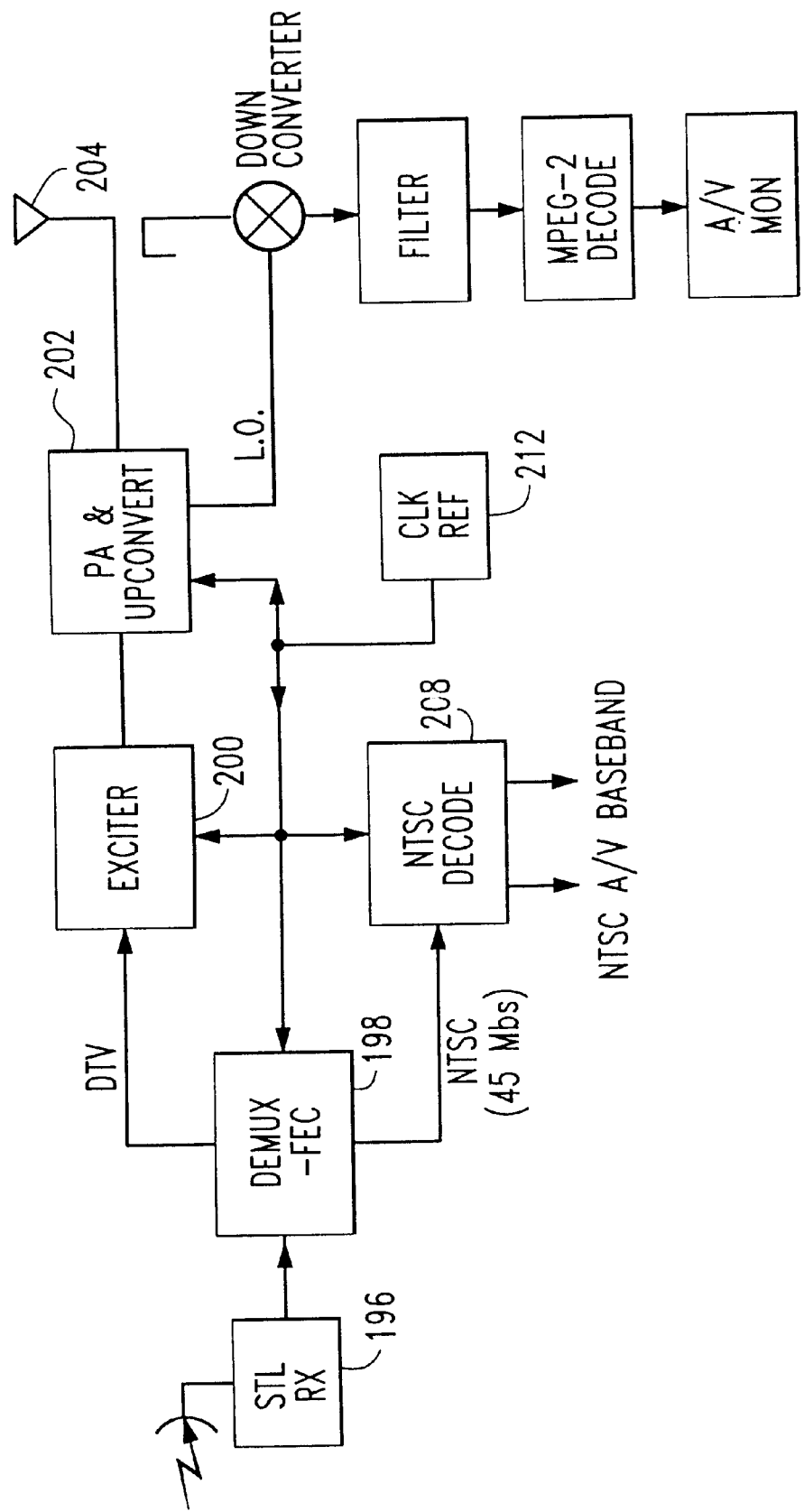
FIG. 19 is a functional block diagram of a transmitter site using an aspect of the present invention.

The tight frequency control requirements which are to be levied upon DTV broadcasters to ensure a minimum of interference with other channels requires that special attention be given to the effects of intermodulation products and frequency stability and control. One system for obtaining satisfactory frequency control is illustrated in the functional block diagrams of FIGS. 18 and 19, which represent a typical site at which the television signals are generated (such as a studio) (FIG. 18) and at which they are broadcast (such as a transmitter site) (FIG. 19). With reference to FIG. 18, television signals, STUDIO A/V, from multiple and alternative sources may be provided to a conventional MPEG-2 encoder 180 which encodes the signals in a conventional fashion using an external clock reference 182. The clock reference 182 may be any highly stable clock source, particularly a clock source which can be readily received at remote locations, such as a GPS signal. The encoder 180 may provide an internal decoder so as to provide a monitor signal to a local audio-visual monitor 184. The encoded television signal(s) are provided to a "Grand Alliance" transport mechanism 186 which will format the incoming MPEG-2 signal into the proper format needed for the "transport layer" of the Grand Alliance system. Alternatively, the GA transport mechanism may receive (through a selectable switch) a signal from an external MPEG-2 signal generator. The transport formatted signal may be provided to a multiplexer 188 which multiplexes the transport formatted signal with other data and provides the multiplexed data to a transmission facility 190 for transmission to a broadcast transmitter site. Along a somewhat parallel path, a "standard television" video signal or signals may be converted to a digital form by an analog to digital converter and the digitized video signal, along with its corresponding digital audio signal, may be provided to a NTSC 4/1 compressor 194. The compressed digital NTSC signal is provided to the multiplexer 1888 for multiplexing with the transport formatted signal and for transmission by the transmission facility 190. Each of the encoder 180, transport mechanism 186, multiplexer 188, A/D 192 and compressor 194 is locked to the common clock reference 182. If the clock reference is taken from the well-known Global Positioning Satellite system (or any similar available, stable system), the studio site can us the 1 MHz reference signal provided by the satellite system. Thus, both the DTV signal (generated by the transport mechanism 186) and the digital NTSC signal are locked for efficient digital transmission to the transmitter site. Because the DTV signal is locked to the common reference clock, multiplexing may be done in a synchronous mode with the digital NTSC signal.

With reference now to FIG. 19, when the multiplexed signal arrives at the transmitter site 196, it may be demultiplexed by a demultiplexer (which may use any Forward Error Correction signals provided by the transmission facility 190) and provided as two data streams, DTV and NTSC. The DTV signal may be formatted for DTV broadcast and amplified by an exciter 200, power amplified and upconverted, and ultimately broadcast through a suitable antenna 204. The NTSC signal may be decoded to baseband by a NTSC decoder 208 and broadcast through conventional means. The demultiplexer 198, exciter 200, PA & Upconverter 202 and the NTSC decoder 208 may each be locked to a common clock reference 212.

The clock reference 212 at the transmitter site is optimally selected to be common to the clock reference 182 used at the studio site (FIG. 18). For example, both sites could use the same GPS reference signal. By using the same reference signal (such as the GPS 10 MHz signal), the DTV signal and the NTSC signal are locked to the same stable source. As a result, the NTSC chroma signal (at 3.58 MHz) is locked to a stable frequency source which will reduce the likelihood and/or severity of interference between the transmitted DTV pilot signal and the transmitted NTSC chroma signal.

Other stable clock reference signals can be used in common between the studio site and the transmitter site to achieve the advantages of the present invention. For example, if the studio site is sufficiently proximate to the transmitter site, the STL transmission can be eliminated and the clock signal can be carried by conventional means between the studio and the transmitter.

If desired, fewer than all of the components shown as being related to the clock reference (CLK REF) in FIGS. 18 and 19 need to be tied to a single (or related) clock reference and come within the teachings of the present invention. The improvements in adjacent and co-channel interference obtained from the use of this embodiment of the present invention can be obtained if only the DTV exciter 200 and the transmitter (PA and Upconvert 202) use a common clock reference. In addition, the advantages of the present invention can be utilized more broadly by using a common clock reference at plural sites. For example, if plural exciters and transmitters use a common stable reference, such as a satellite signal, each could generate a NTSC and DTV signal which would reduce interference not only with the co-generated television signals but also with other signals generated at other sites whose assigned channels may have otherwise caused interference from frequency inaccuracies.

While preferred embodiments of the present invention have been described, it is to be understood that the embodiments described are illustrative only and the scope of the invention is to be defined solely by the appended claims when accorded a full range of equivalence, many variations and modifications naturally occurring to those of skill in the art from a perusal hereof.

What is claimed is:

1. In a digital signal system in which digital signals are received in frames of M digital bits and in which each frame contains a specified sync code of N bits, a method for determining whether the system has synchronized to the framing of the digital signals comprising the steps of:

(1) receiving a serial stream of digital bits;

(2) converting said received stream into a parallel form having N bits;

(3) for each received digital bit, comparing the parallel form of N bits for a match with the specified sync code;

(4) if a match is not found in the comparison, go to step (3);

(5) if a match is found in the most recent comparison,
   (a) setting a counter to locate the next expected occurrence of said sync code within the serial stream;
   (b) incrementing a confidence counter by 1;
   (c) if the confidence counter reaches a specified threshold, indicating that sync has been established;
   (d) at the next expected occurrence of said sync code within the serial stream, comparing the parallel form of the N bits at that time for a match with the specified sync code;
   (e) go to step (5);

(6) if no match is found in the most recent comparison,
   (a) setting a counter to locate the next expected occurrence of said sync code within the serial stream;
   (b) decrementing the confidence counter by 1;
   (c) if the confidence counter falls to a second specified threshold, indicating that sync is not established and returning to step (3);
   (d) go to step (5).

2. A frame sync detection circuit for digital televisions systems in which digital television signals are received which comprise sequential digital words including a word designating a frame signal, the frame sync detection circuit comprising:

a sync word detection circuit for monitoring the digital television signals and providing a frame signal output when a word corresponding to the frame signal is detected;

a sync confidence counter circuit for receiving the frame signal output from the sync word detection circuit, and is adapted to, when enabled, to be incremented by the receipt of the frame signal and decremented by the absence of the frame signal, the sync confidence counter circuit providing a sync lock signal when a preset count is reached, and a frame counter circuit for receiving the digital television signals and providing an enable signal to the sync confidence counter circuit when a frame count is reached.

3. A frame sync detection circuit as defined in claim 2 including:

a frame search initiation circuit for initiating a new frame search if the sync confidence counter circuit is below a preset level, wherein the sync confidence counter circuit is enabled to be incremented to count the first frame signal received from the sync word detector circuit and the frame counter circuit is enabled to start a new frame count upon the incrementation of the sync confidence counter circuit.

4. A frame sync detection circuit as defined in claim 3 wherein:

the frame search initiation circuit is adapted to start a new frame search if after the initial incrementation of the sync confidence counter circuit a subsequent frame signal is not received when the frame counter circuit reaches the next frame count.

5. A digital television system in which digital television signals are received which comprise sequential digital words including a word designating a frame signal, the digital television system comprising:

a circuit for formatting digital television for use in the system, including frame sync circuit;

a sync word detection circuit for receiving the digital television signals from the formatting circuit for monitoring the digital televisions and providing an frame signal output when a word corresponding to the frame signal is detected;

a sync confidence counter circuit for receiving the frame signal output from the sync word detection circuit, and is adapted to, when enabled, to be incremented by the receipt of the frame signal and decremented by the absence of the frame signal, the sync confidence counter circuit providing a sync lock signal to the formatting circuit when a preset count is reached, and a frame counter circuit for receiving the digital television signals and providing an enable signal to the sync confidence counter circuit when a frame count is reached.

6. A digital television as defined in claim 5 including:

a frame search initiation circuit for initiating a new frame search if the sync confidence counter circuit is below a preset level, wherein the sync confidence counter circuit is enabled to be incremented to count a first frame signal received from the sync word detector circuit and the frame counter circuit is enabled to start a new frame count upon the incrementation of the sync confidence counter circuit, and the frame search initiation circuit is adapted to start a new frame search if after the initial incrementation of the sync confidence counter circuit a subsequent frame signal is not received when the frame counter circuit reaches the next frame count.

7. A method of detecting frame sync signals in digital televisions systems in which digital television signals are received which comprise sequential digital words including a word designating a frame signal, the method comprising:

monitoring the digital televisions and providing a frame signal output when a word corresponding to the frame signal is detected;

counting the digital television signals to provide a frame count enable signal when a frame count is reached, and enabling a sync confidence counter circuit receiving the frame signal output from a sync word detection circuit to be incremented by the frame signal during the presence of the frame count enable signal and decremented by the absence of the frame signal during the presence of the frame count enable signal, to provide a sync lock signal when a preset count is reached.

8. The method of detecting frame sync signals as defined in claim 7 including the step of:

initiating a new frame search if the sync confidence counter circuit is below a preset level by enabling the sync confidence counter circuit to be incremented to count a first frame signal received and enabling the frame counting to start a new frame count upon the incrementation of the sync confidence counter circuit.

9. The method of detecting frame sync as defined in claim 8 including the step of:

starting a new frame search if after the initial incrementation of the sync confidence counter circuit a subsequent frame signal is not received when the next frame count is reached.

10. In a digital signal system in which digital signals are received in frames of M digital bits and in which each frame contains a specified sync code of N bits, a method for determining whether the system has synchronized to the framing of the digital signals comprising the steps of:

(1) for each received digital bit, comparing a parallel form of N bits for a match with a specified sync code in a sync detection mode;

(2) if a match is not found in the comparison, go to step (1);

(3) if a match is found in the comparison, compare the parallel form of N bits for a match with the specified sync code at the next expected occurrence of said sync code within a serial stream in a sync lock mode and increment a counter if there is a match in the comparison in the sync lock mode and decrement the counter if there is not a match in the comparison;

(4) if the incremented counter reaches a predetermined value, provide a SYNC LOCK signal and compare the parallel form of N bits for a match with the specified sync code at the next expected occurrence of said sync code within the serial stream in the sync lock mode and go to step (3);

(5) if the decremented counter reaches a predetermined lower value removing the SYNC LOCK signal and go to step (1) and if the decremented counter does not reach the predetermined lower value, compare the parallel form of N bits for a match with the specified sync code at the next expected occurrence of said sync code within the serial stream in the sync lock mode and go to step (3).

11. In a digital signal system in which digital signals are received in frames of M digital bits and in which each frame contains a specified sync code of N bits, a method for determining whether the system has synchronized to the framing of the digital signals comprising the steps of:

(1) evaluating each pulse for a sync pulse until a sync pulse is found when a value in a counter is below a predetermined minimum;

(2) checking for a sync pulse at a next expected sync pulse location, incrementing the counter up to a predetermined maximum number if the sync pulse is found and decrementing the counter if the sync pulse is not found;

(3) repeating step (2) until the value in the counter falls below the predetermined minimum at which time go to step (1); and (4) indicating a lack of sync when step (1) is being performed and indicate sync when steps (2) or (3) are being performed.

* * * * *